(12) United States Patent
Park

(10) Patent No.: US 6,246,631 B1
(45) Date of Patent: Jun. 12, 2001

(54) SEMICONDUCTOR MEMORY DEVICE

(75) Inventor: Jong Tai Park, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/599,465

(22) Filed: Jun. 22, 2000

(30) Foreign Application Priority Data

Jun. 29, 1999 (KR) ............................................. 1999-25354

(51) Int. Cl.[7] ................................................... G11C 8/00
(52) U.S. Cl. ............................ 365/230.06; 365/230.03; 365/222
(58) Field of Search .......................... 365/185.11, 185.23, 365/222, 230.03, 230.04, 230.06

(56) References Cited

U.S. PATENT DOCUMENTS

| 4,393,476 | 7/1983 | Ong | 365/203 |
|---|---|---|---|
| 5,243,557 | 9/1993 | Maeda et al. | 365/177 |
| 5,313,423 * | 5/1994 | Sato et al. | 365/200 |
| 5,414,660 | 5/1995 | Sugibayashi et al. | 365/200 |
| 5,416,748 | 5/1995 | Fujita | 365/51 |
| 5,539,698 | 7/1996 | Suzuki | 365/200 |
| 5,596,542 | 1/1997 | Sugibayashi et al. | 365/230.06 |
| 5,864,496 | 1/1999 | Mueller et al. | 365/69 |
| 5,889,712 | 3/1999 | Sugibayashi | 365/200 |
| 6,038,634 * | 3/2000 | Ji et al. | 365/230.03 |
| 6,049,502 * | 4/2000 | Cowles et al. | 365/230.03 |
| 6,064,605 * | 5/2000 | Muranaka et al. | 365/189.03 |
| 6,064,619 * | 5/2000 | Ahn et al. | 365/230.03 |

* cited by examiner

Primary Examiner—Richard Elms
Assistant Examiner—VanThu Nguyen
(74) Attorney, Agent, or Firm—Nath & Associates PLLC; Gary M. Nath

(57) ABSTRACT

The present invention discloses a semiconductor memory device having an NK refresh cycle, which can lower an enable speed of a word line by reducing a resistance and a capacitance of the word line enabled during an access operation by using a redundant row address. When the 2NK and NK refresh operations are simultaneously embodied, the read/write operation is carried out by using an address compressed in the device set up by the NK refresh operation. As a result, as compared with the 2NK refresh operation, a length of the word line to be enabled is reduced to a half, and the number of the cells connected to the word line is also decreased, thereby remarkably improving the speed at the row path side.

12 Claims, 6 Drawing Sheets

SEMICONDUCTOR MEMORY DEVICE

BACKGROUND OF THE INVENTION

The present invention relates to a semiconductor memory device, and in particular to a semiconductor memory device which can enable a double word line by using the fact that word lines of two blocks are enabled at the same time in a block set of 2N rows during an NK refresh operation.

In an isolated cell capacitor, a data is stored in the form of electric charges. The electric charges stored in the cell capacitor become extinct by the leakage current. It is thus necessary to bring out, read and re-write the data before the data is completely extinguished. This is called a refresh operation.

The refresh operation is performed by varying a row address strobe signal/RAS from high to low, turning on a word line corresponding to a row address, and enabling a sense amp. Accordingly, all the cells connected to one word line are refreshed at the same time.

The refresh operation of the DRAM is carried out by one cycle of externally receiving a refresh address and dropping and raising the RAS signal/RAS. A refresh cycle indicates the number of the cycles selecting all the rows of the DRAM and finishing the refresh operation. That is, the refresh cycle indicates how many word lines must be enabled to refresh all cells of the DRAM.

The conventional memory device such as the DRAM is so designed that its refresh cycle can simultaneously support the NK and 2NK refresh operations, and is processed according to a bonding option. After fabricated, the memory device is used on a board where the NK refresh operation is supported or a board where the 2NK refresh operation is supported. In general, in the case of the 2NK refresh operation, the memory device is processed according to the "H" bonding option, and in the case of the NK refresh operation, the memory device is processed according to the "L" bonding option.

The conventional memory device always performs an access operation (namely, read/write) according to the 2NK refresh operation, regardless of the refresh cycle.

FIG. 1 is a block diagram showing addresses of a row path of the conventional semiconductor memory device performing the NK refresh operation.

A first buffer 10 receives and buffers a block set division address ADD_2NK and a row active refresh mode designating signal NK_REFRESHB, a second buffer 12 receives and buffers a block selection address ADD_BLOCK, and a third buffer 14 receives and buffers a word line selection address ADD_WL for selecting one word line from a cell array in the selected block.

When the refresh mode designating signal NK_REFRESHB is at a low level, output signals ADDX_2NK, ADDXB_2NK from the first buffer 10 are compressed and fixed to a high level. The fixed signals are re-buffered in a fourth buffer 16 with output signals ADDX_BLOCK, ADDXB_BLOCK from the second buffer 12, and inputted to a block control unit 20. The block set division address ADD_2NK is compressed in the block control unit 20, and thus two of the 2N blocks (B; set of cell arrays) are selected. Output signals ADDX_WL, ADDXB_WL from the third buffer 14 are re-buffered in a fifth buffer 18, decoded by a decoder 22 and inputted to the two selected blocks B.

Accordingly, a bit line sense amp BL S/A and a bit line are connected by corresponding bit line sense amp control units CTRL_1~CTRL_2n+1 in the two selected blocks B. The word lines existing on the cell arrays 24a, 24b, 24c, 24d in the two blocks B are enabled by main word line driving units MWL_1~MWL_2n.

FIG. 2 is a block diagram illustrating the address ADD_2NK for dividing the whole cell array into two in the conventional 2NK block set. The conventional 2NK block set consists of two 1NK block sets, and the respective cell arrays 0~N include K word lines. The most significant bit of the addresses 00 . . . 00~11 . . . 11 for respectively designating the cell arrays is the address ADD_2NK which divides the whole cell array into two in the 2NK block set and which is compressed during the NK refresh operation. On the other hand, the addresses except for the most significant bit become the block selection addresses ADD_BLOCK. An upper cell array and a lower cell array are selected at the same time by the identical block selection address ADD_BLOCK in the block set which is divided into an upper NK block set and a lower NK block set due to the address ADD_2NK compressed during the NK refresh operation.

As described above, in the case that the NK refresh operation and the 2NK refresh operation are implemented in one memory device and the NK refresh operation is performed by the bonding option, any of the row addresses is not used, and the number of the word lines to be enabled during the read/write operation is increased by two times. As a result, the current consumption of the row path is increased by two times during the access operation, as compared with the semiconductor memory device performing the 2NK refresh operation.

SUMMARY OF THE INVENTION

Accordingly, it is an object of the present invention to provide a semiconductor memory device having an NK refresh cycle, which can lower an enable speed of a word line by reducing a resistance and a capacitance of the word line enabled during an access operation by using a redundant row address.

In order to achieve the above-described object of the present invention, there is provided a semiconductor memory device having a block set consisting of a plurality of blocks which are aligned in a vertical direction and which consist of a plurality of cell arrays aligned in a horizontal direction, including: a unit for receiving and buffering a block set division address, a refresh mode designating signal and a refresh request signal; a unit for receiving the block set division address to be compressed among the output signals from the buffering unit and a block selection address, and selecting one of the plurality of blocks; a unit for decoding modified signals outputted from the buffering unit, and selecting a right-side or left-side cell array group of a main word line having a double word line structure from the selected block; and a unit for buffering and decoding word line selection address signals, and driving a corresponding main word line, the block set being divided into the identical number of the cell array groups symmetrically from a sub-word line driver positioned at the centers of each block, the right-side cell array groups and the left-side cell array groups being connected respectively to the main word line driving units through the different main word lines.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A semiconductor memory device in accordance with a preferred embodiment of the present invention will now be described in more detail with reference to the accompanying drawings.

Figure 1:
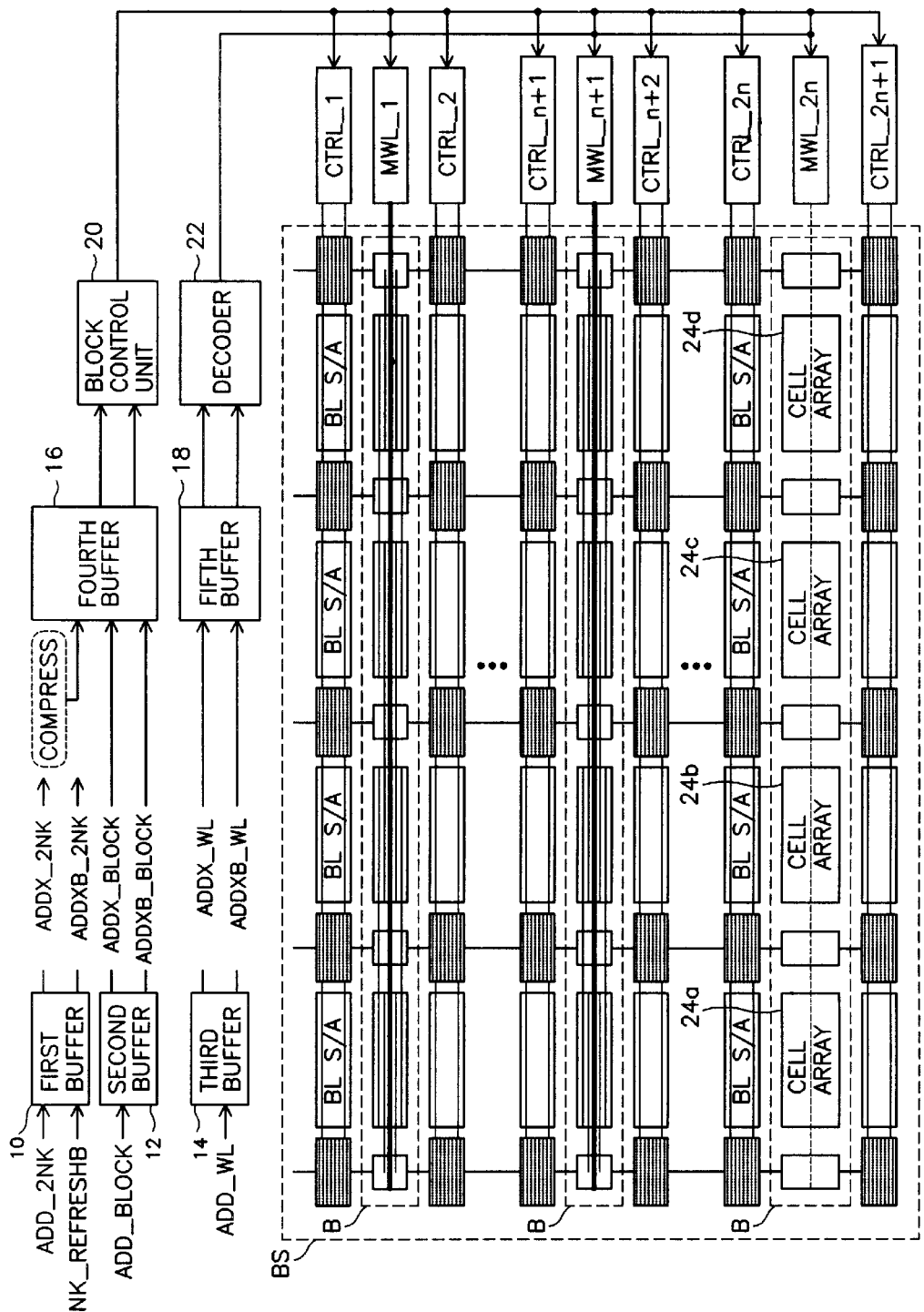
FIG. 1 is a block diagram showing addresses of a row path of a conventional semiconductor memory device performing an NK refresh operation.
Figure 2:
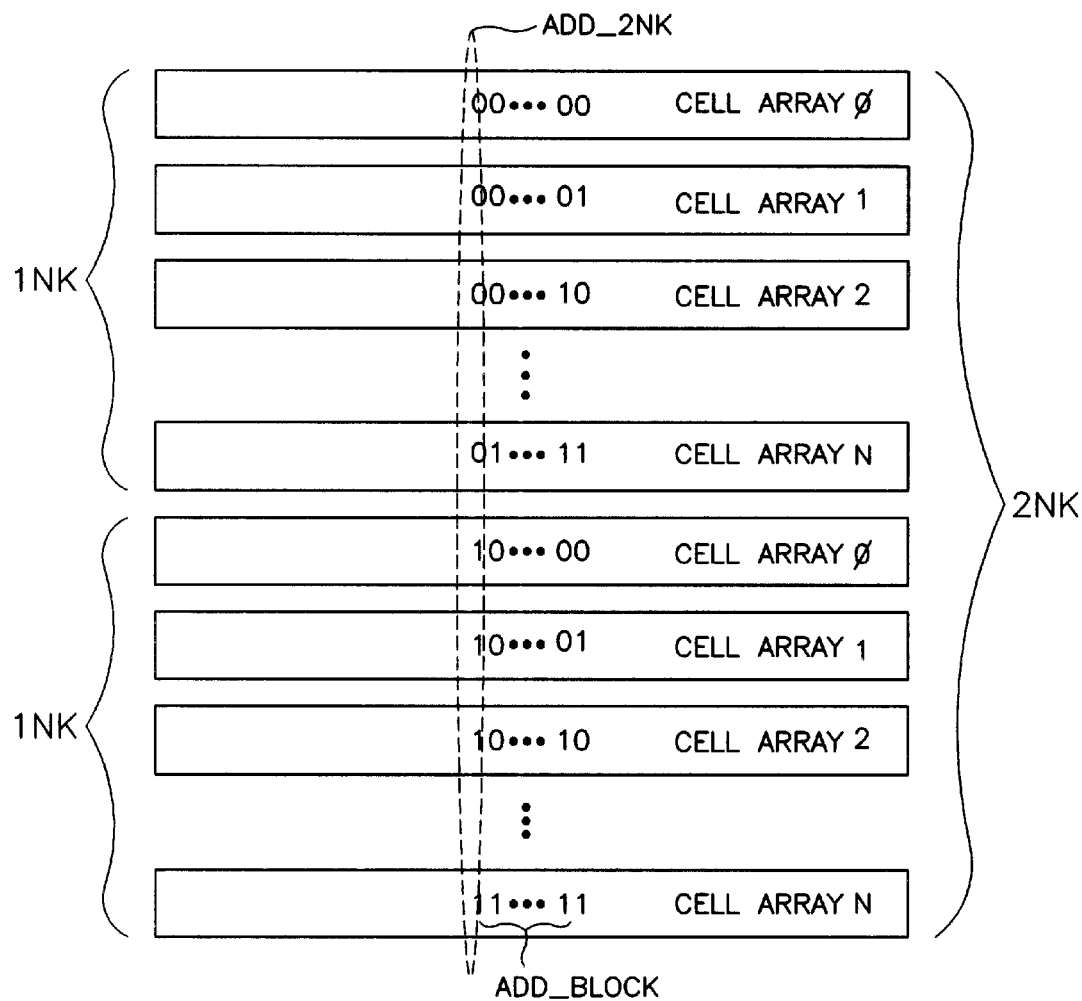
FIG. 2 is a block diagram showing addresses for dividing the whole cell array into two in a conventional 2NK block set.
Figure 3:
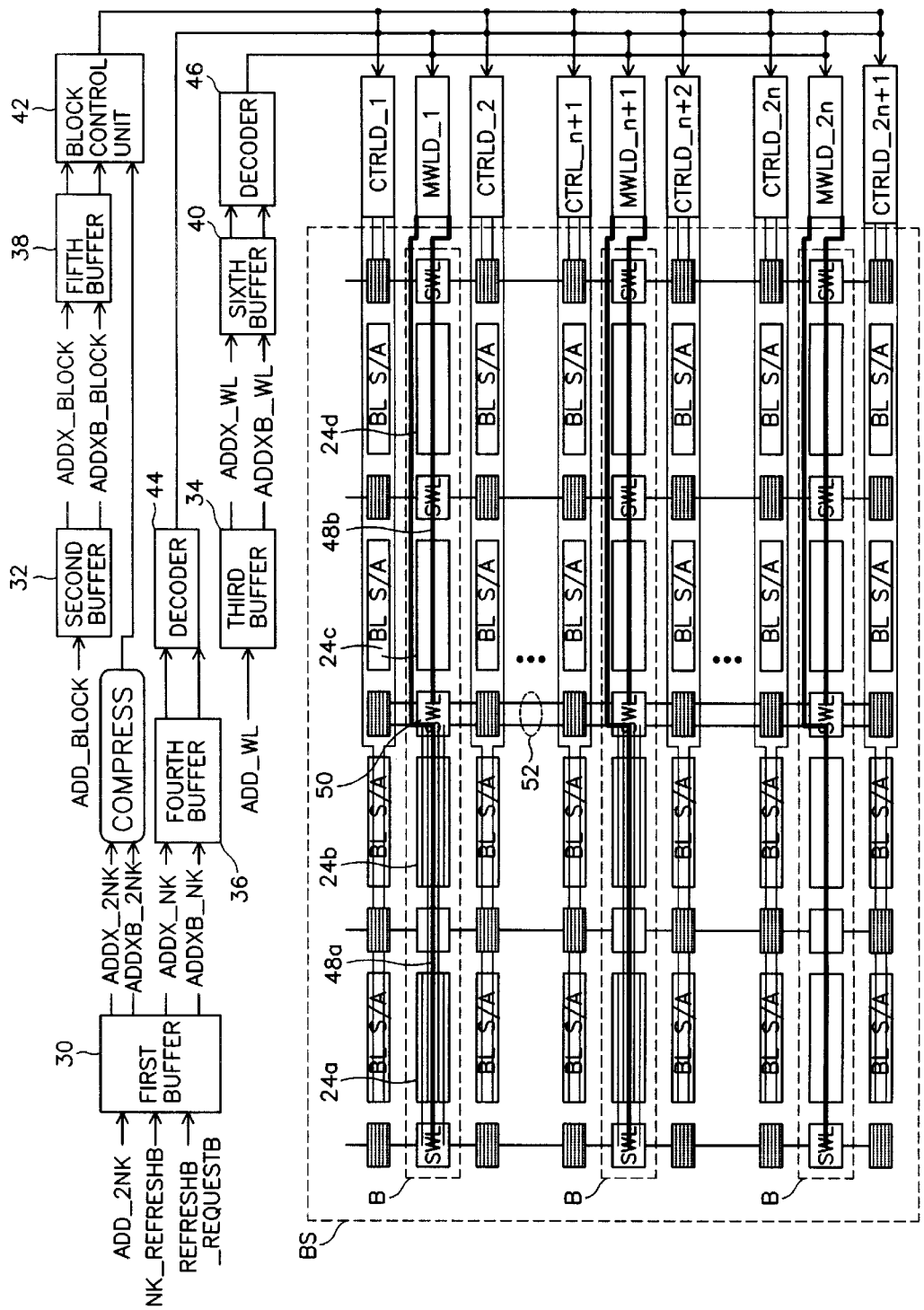
FIG. 3 is a block diagram showing a semiconductor memory device in accordance with a preferred embodiment of the present invention.

FIG. 3 is a block diagram showing the semiconductor memory device in accordance with the preferred embodiment of the present invention.

As illustrated in FIG. 3, a first buffer 30 receives and buffers a block set division address ADD_2NK, a refresh mode designating signal NK_REFRESHB and a refresh request signal REFRESH_REQUESTB, a second buffer 32 receives and buffers a block selection address add_block, and a third buffer 34 receives and buffers a word line selection address ADD_WL.

A fourth buffer 36 receives and buffers modified signals ADDX_NK, ADDXB_NK outputted from the first buffer 30, a fifth buffer 38 receives and buffers signals ADDX_BLOCK, ADDXB_BLOCK outputted from the second buffer 32, and applies the signals to a block control unit 42, and a sixth buffer 40 receives and buffers signals ADDX_WL, ADDXB_WL outputted from the third buffer 34. In addition, after compressed, the signals ADDX_2NK, ADDXB_2NK outputted from the first buffer 30 are inputted to the block control unit 42.

The modified signals ADDX_NK, ADDXB_NK are non-compressed addresses for deciding a left side MWL_L of a main word line, namely a left-side cell array group 24a, 24b of a block B, or a right side MWL_R of the main word line, namely a right-side cell array group 24c, 24d of the block B in a double word line structure. The addresses ADDX_NK, ADDXB_NK are generated separately from the block set division address ADD_2NK which is compressed as a result of the buffering of the first buffer 30.

The block control unit 42 selects one of the plurality of blocks B according to a signal inputted from the fifth buffer 38, and transmits the signal to a bit line sense amp control unit CTRLD_1~CTRLD_2n+1 provided correspondingly to the selected block B.

A decoder 46 decodes a signal outputted from the sixth buffer 40, and transmits the result to main word line driving units MWLD_1~MWLD_2n provided correspondingly to the respective blocks B.

A decoder 44 decodes a signal outputted from the fourth buffer 36, and transmits the result to the bit line sense amp control units CTRLD_1~CTRLD_2n+1 and the main word line driving units MWLD_1~MWLD_2n that are provided correspondingly to the respective blocks B.

A block set BS consists of the plurality of blocks B. The respective blocks B includes the plurality of cell arrays 24a, 24b, 24c, 24d. In the case that each block B is divided into the identical number of the cell array groups 24a, 24b; 24c, 24d symmetrically from a sub-word line driver 50, the left-side cell array group 24a, 24b and the right-side cell array group 24c, 24d are connected respectively to the main word line driving units MWLD_1~MWLD_2n through different main word lines 48a, 48b. Two word line boosting signals(Vpp) lines 52 are connected to the sub-word line driver 50, and the word line boosting signal lines 52 manage the left-side cell array group 24a, 24b and the right-side cell array group 24c, 24d, respectively.

In this embodiment, the two word line boosting signal lines 52 are connected to the sub-word line driver 50. However, only one word line boosting signal line may be used.

The bit line sense amp control units CTRLD_1~CTRLD_2n+1 select BISH (not shown) and BISL (not shown) which turn on/off a bit line sense amp BL S/A and the cell array with the block selection address ADD_BLOCK, and also select BISH_R and BISL_R (right-side cell array group of each block B) or BISH_L and BISL_L (left-side cell array group of each block B) according to the modified signals ADDX_NK, ADDXB_NK.

The main word line driving units MWLD_1~MWLD_2n select one of the right and left sides of one to a few word lines from the cell array, namely one of MWL_R and MWL_L.

Figure 4:
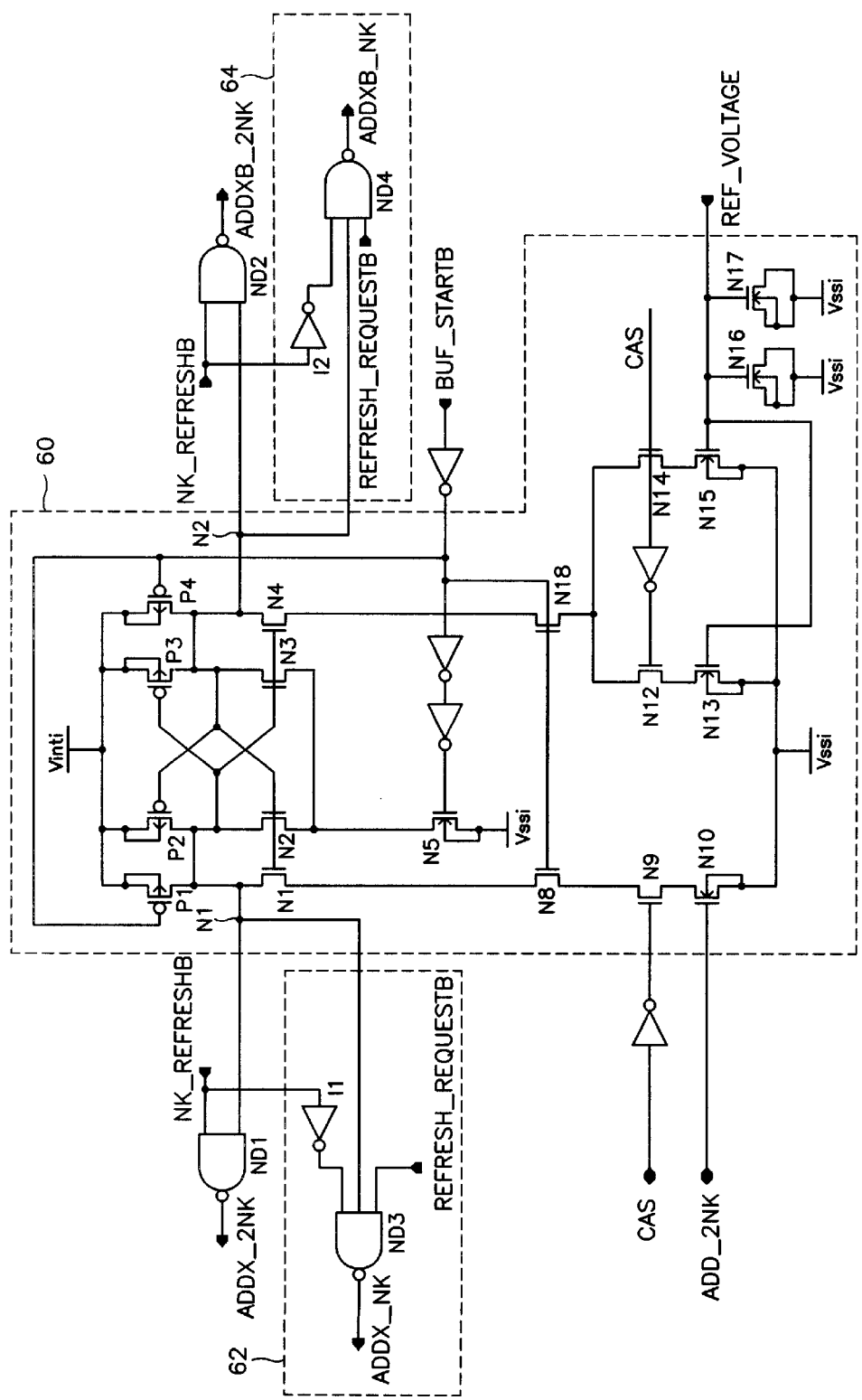
FIG. 4 is a block diagram illustrating one example of an inside circuit of a first buffer as shown in FIG. 3.

FIG. 4 is a block diagram illustrating one example of an inside circuit of the first buffer 30 as shown in FIG. 3. The first buffer 30 includes: a differential amplifier 60 for comparing the block set division address ADD_2NK with the reference voltage; a first NAND gate ND1 for receiving and NANDing a signal from one output terminal N1 of the differential amplifier 60 and the refresh mode designating signal NK_REFRESHB, and outputting the signal ADDX_2NK to be compressed; a NAND gate NK2 for receiving and NANDing a signal from the other output terminal N2 of the differential amplifier 60 and the refresh mode designating signal NK_REFRESHB, and outputting the signal ADDXB_2NK to be compressed with the signal ADDX_2NK; a logic circuit unit 62 for receiving and logic-operating the signal from one output terminal N1 of the differential amplifier 60, the refresh mode designating signal NK_REFRESHB and the refresh request signal REFRESH_REQUESTB, and outputting the modified signal ADDX_NK; and a logic circuit unit 64 for receiving and logic-operating the signal from the other output terminal N2 of the differential amplifier 60, the refresh mode designating signal NK_REFRESHB and the refresh request signal REFRESH_REQUESTB, and outputting the modified signal ADDXB_NK.

The differential amplifier 60 includes: cross-coupled PMOS transistors P2, P3; cross-coupled NMOS transistors N2, N3; a PMOS transistor P1 connected in parallel to the PMOS transistor P2, and turned on/off according to a buffering start signal BUF_STARTB; a PMOS transistor P4 connected in parallel to the PMOS transistor P3, and turned on/off according to the buffering start signal BUF_STARTB; an NMOS transistor N1 having its gate connected to a gate of the NMOS transistor N2, and its drain connected to the output terminal N1; an NMOS transistor N43 having its gate connected to a gate of the NMOS transistor N3, and its drain connected to the output terminal N2; an NMOS transistor N5 having its drain commonly connected to sources of the NMOS transistors N2, N3, its source grounded, and its gate connected to receive the buffering start signal BUF_STARTB delayed by a plurality of inverters; an NMOS transistor N8 having its drain connected to a source of the NMOS transistor N1, and turned on/off according to the buffering start signal BUF_STARTB; an NMOS transistor N18 having its drain connected to a source of the NMOS transistor N4, and turned on/off according to the buffering start signal BUF_STARTB; an NMOS transistor N9 having its drain connected to a source of the NMOS transistor N8, and controlled according to a CAS signal; NMOS transistors N12, N14 connected in parallel to a source of the NMOS transistor N18, and operated inversely to the CAS signal of a predetermined level; an NMOS transistor N13 connected between the NMOS transistor N12 and the ground Vssi, and having its gate connected to receive the reference voltage REF_VOLTAGE(Vinti/2); and an NMOS transistor N15 connected between the NMOS transistor N14 and the ground Vssi, and having its gate connected to receive the reference voltage REF_VOLTAGE (Vinti/2).

The logic circuit units 62, 64 respectively include: inverters I1, I2 for inverting the refresh mode designating signal NK_REFRESHB; and three input NAND gates ND3, ND4 for receiving and NANDing output signals from the inverters I1, I2, the signals from the output terminals N1, N2 of the differential amplifier 60 and the refresh request signal REFRESH_REQUESTB.

The operation of the first buffer 30 will now be explained. When the refresh mode designating signal NK_REFRESHB is at a low level and the refresh request signal REFRESH_REQUESTB is at a high level (namely when the access operation of the double word line structure is performed in the NK refresh mode), if the signal of the block set division address ADD_2NK is greater than the reference voltage REF_VOLTAGE, the output terminal N1 of the differential amplifier 60 becomes a low level and the output terminal N2 thereof becomes a high level. Therefore, the logic circuit unit 62 outputs a high level signal ADDX_NK, and the logic circuit unit 64 outputs a low level signal ADDXB_NK.

On the other hand, when the refresh mode designating signal NK_REFRESHB is at a low level and the refresh request signal REFRESH_REQUESTB is at a high level (namely when the access operation of the double word line structure is performed in the NK refresh mode), if the signal of the block set division address ADD_2NK is smaller than the reference voltage REF_VOLTAGE, the output terminal N1 of the differential amplifier 60 becomes a high level, and the output terminal N2 thereof becomes a low level. Accordingly, the logic circuit unit 62 outputs the low level signal ADDX_NK, and the logic circuit unit 64 outputs the high level signal ADDXB_NK.

As described above, the output signal ADDX_NK from the first buffer 30 that is outputted at a high level in the NK refresh mode is used to select the left side MWL_L of the main word line (main word line of the left-side cell array group 24a, 24b of the block B). The output signal ADDXB_NK from the first buffer 30 that is outputted at a high level is used to select the right side MWL_R of the main word line (main word line of the right-side cell array group 24c, 24d of the block B).

Figure 5:
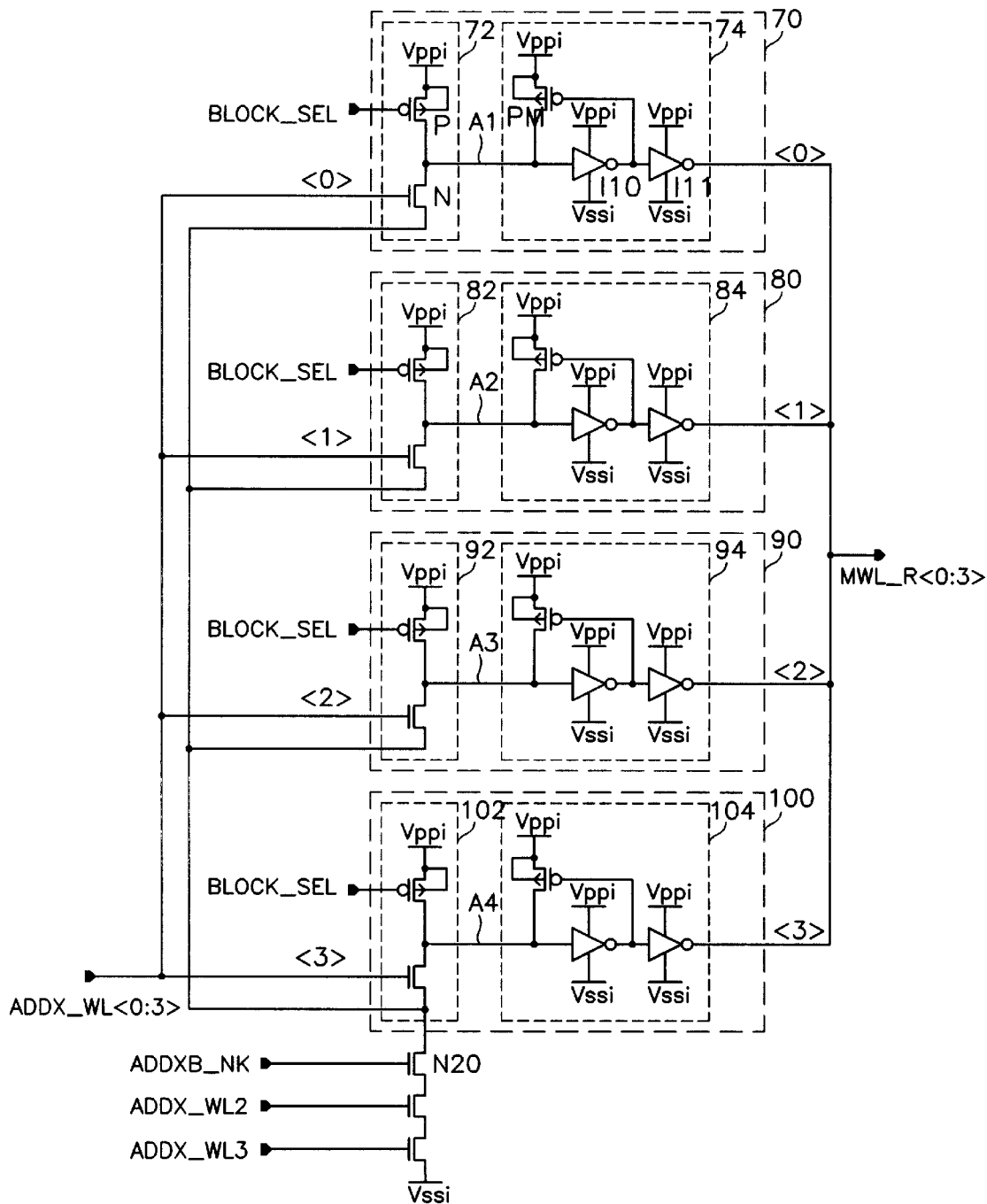
FIGS. 5 and 6 are inside structure diagrams respectively illustrating a main word line driving circuit unit as shown in FIG. 3.

FIG. 5 is an inside structure diagram illustrating the main word line driving circuit unit as shown in FIG. 3.

FIG. 5 is a circuit diagram of selecting the right side of the main word line, namely the right-side cell array groups 24c, 24d of each block B.

As illustrated in FIG. 5, the main word line driving circuit unit is driven when the signal ADDXB_NK outputted from the logic circuit unit 64 of the first buffer 30 is at a high level, and enables the right side MWL_R<0:3> of the main word line along the corresponding path in accordance with the word line selection address ADDX_WL1<0:3> signal.

That is, the main word line driving circuit unit includes: a first path control circuit 70 for enabling the corresponding main word line MWL_R<0> according to the word line selection address ADDX_WL1<0> signal; a second path control circuit 80 for enabling the corresponding main word line MWL_R<1> according to the word line selection address ADDX_WL1<1> signal; a third path control circuit 90 for enabling the corresponding main word line MWL_R<2> according to the word line selection address ADDX_WL1<2> signal; and a fourth path control circuit 100 for enabling the corresponding main word line MWL_R<3> according to the word line selection address ADDX_WL1<3> signal.

The first path control circuit 70 includes: a precharge unit 72 for precharging a signal from an output terminal A1 to a predetermined level according to the block selection signal BLOCK_SEL and the word line selection address ADDX_WL1<0> signal; and a latch unit 74 for latching an output signal from the precharge unit 72, and driving the corresponding main word line MWL_R<0>.

The precharge unit 72 includes: a PMOS transistor P connected between the power supply terminal Vppi and the output terminal A1, and turned on/off according to the block selection signal BLOCK_SEL; and an NMOS transistor N connected between the output terminal A1 and the drain of the NMOS transistor N20 turned on/off according to the signal ADDXB_NK outputted from the logic circuit unit 64 of the first buffer 30, and turned on/off according to the word line selection address ADDX_WL1<0> signal. The latch unit 74 includes: inverters I10, I11 connected in series between the output terminal A1 and the main word line MWL_R<0>; and a PMOS transistor PM connected between the power supply terminal Vppi and the output terminal A1, and turned on/off according to an output signal from the inverter I10.

The second path control circuit 80 includes: a precharge unit 82 for precharging a signal from an output terminal A2 to a predetermined level according to the block selection signal BLOCK_SEL and the word line selection address ADDX_WL1<1> signal; and a latch unit 84 for latching an output signal from the precharge unit 82, and driving the corresponding main word line MWL_R<1>. The inside circuit constitution of the precharge unit 82 and the latch unit 84 are identical to that of the precharge unit 72 and the latch unit 84 as described above.

The third path control circuit 90 includes: a precharge unit 92 for precharging a signal from an output terminal A3 to a predetermined level according to the block selection signal BLOCK_SEL and the word line selection address ADDX_WL1<2> signal; and a latch unit 94 for latching an output signal from the precharge unit 92, and driving the corresponding main word line MWL_R<2>. The inside circuit constitution of the precharge unit 92 and the latch unit 94 are identical to that of the precharge unit 72 and the latch unit 84 as described above.

The fourth path control circuit 100 includes: a precharge unit 102 for precharging a signal from an output terminal A4 to a predetermined level according to the block selection signal BLOCK_SEL and the word line selection address ADDX_WL1<3> signal; and a latch unit 104 for latching an output signal from the precharge unit 102, and driving the corresponding main word line MWL_R<3>. The inside circuit constitution of the precharge unit 102 and the latch unit 104 are identical to that of the precharge unit 72 and the latch unit 84 as described above.

Figure 6:
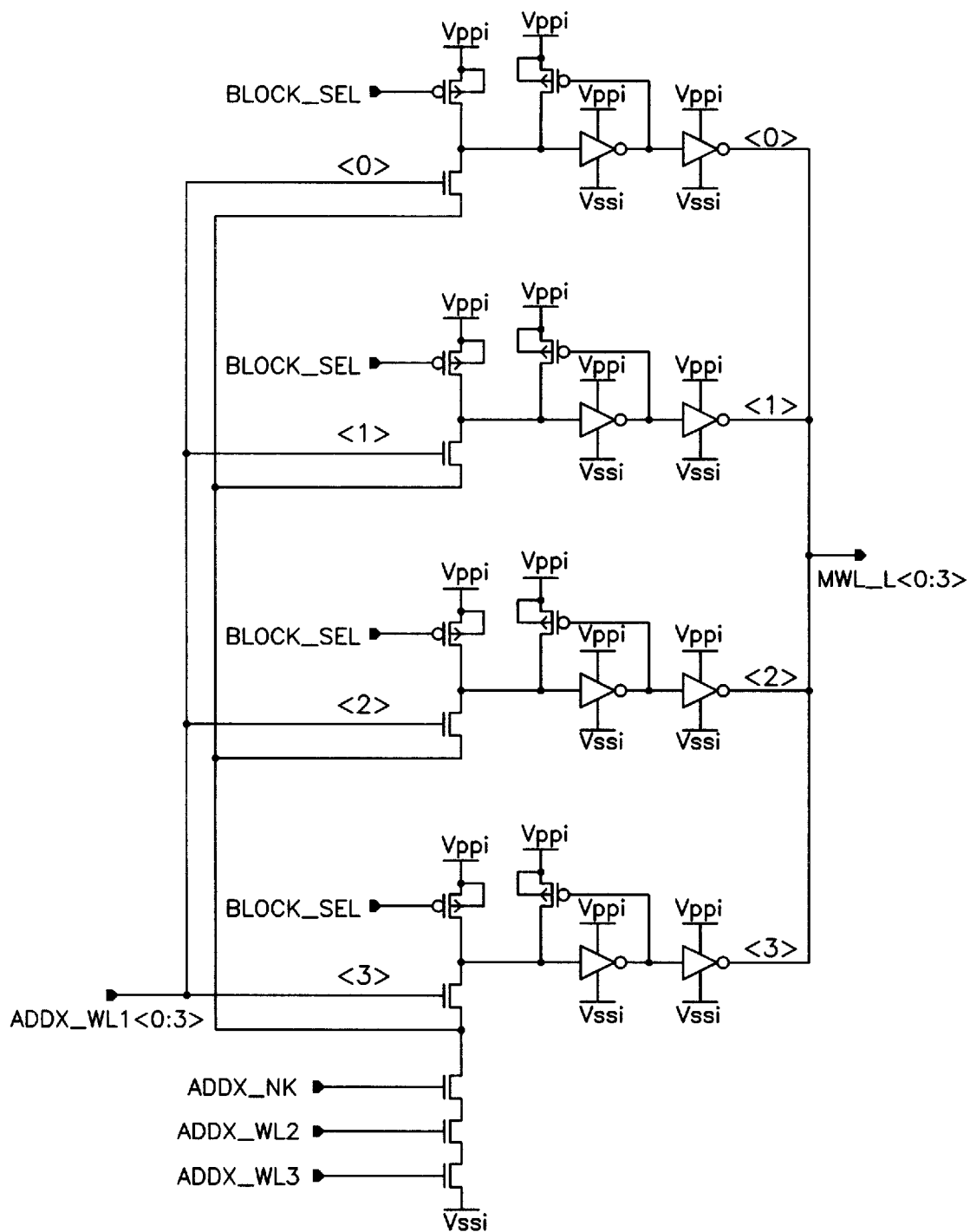

FIG. 6 is a circuit diagram of selecting the left side of the main word line, namely the left-side cell array groups 24a, 24b of each block B.

As depicted in FIG. 6, the main word line driving circuit unit is driven when the signal ADDX_NK outputted from the logic circuit unit 62 of the first buffer 30 is at a high level, and enables the main word line MWL_L<3> along the corresponding path according to the word line selection address ADDX_WL1<0:3> signal. The circuit constitution of FIG. 6 is identical to that of FIG. 5, and thus it will not be described.

On the other hand, although the embodiment of the present invention is applied to the row path, if the column pass is operated as usual, the mis-operation is generated. That is, when yi signal connecting the bit line to the data bus line is enabled in the block set BS one by one as in the conventional art, if the row path opens an area of the rightside cell array group of the block B by the operation according to the present invention, the yi signal is enabled in an area of the left-side cell array group, and thus the bit line and the data bus line are not connected.

As a result, the yi signal must be enabled in the block set BS two by two in order to embody the operation of the present invention in the semiconductor memory device performing the NK refresh operation. For this, when the refresh mode designating signal NK_REFRESHB is enabled at a low level, an address Y-add for selecting a largest area of the block B is compressed, and thus the yi signal is always enabled in MWL_R or MWL_L on the row path. In case the two yi signals are enabled in the cell array (or the word line) on one block B during the 2NK refresh operation, two data collide with each other on the data bus line, which must be controlled according to the refresh mode designating signal NK_REFRESHB.

The operation of the semiconductor memory device in accordance with the preferred embodiment of the present invention will now be explained.

The first buffer 30 buffers the inputted signals ADD_2NK, NK_REFRESHB, REFRESH_REQUESTB, and outputs the addresses ADDX_2NK, ADDXB_2NK, ADDX_NK, ADDXB_NK. Here, the addresses ADDX_2NK, ADDXB_2NK will be compressed and the addresses ADDX_NK, ADDXB_NK will not be compressed.

According to the preferred embodiment of the present invention, when the refresh request signal REFRESH_REQUESTB inputted to the first buffer 30 is at a high level in the NK refresh mode, the access operation of the double word line structure is performed. In the case that the refresh request signal REFRESH_REQUESTB is at a low level, the normal NK refresh operation is carried out. That is, when the refresh request signal REFRESH_REQUESTB notifying that the refresh operation has been started is enabled at a low level, the output signals ADDX_NK, ADDXB_NK from the NAND gates ND3, ND4 in the first buffer 30 become a high level, thereby enabling the right and left sides of the main word line of the cell array at the same time.

On the other hand, the output addresses ADDX_2NK, ADDXB_2NK are compressed and inputted to the block control unit 42, and the addresses ADDX_NK, ADDXB_NK which are not compressed pass through the fourth buffer 44, are decoded in the decoder 44, and inputted to the bit line sense amp circuit unit CTRLD_1~CTRLD_2n+1 and the main word line driving unit MWLD_1~MWLD_2n.

Accordingly, the bit line sense amp circuit unit CTRLD_1~CTRLD_2n+1 selects BISH and BISL turning on/off the bit line sense amp BL S/A and the cell array of the block B selected by the block selection address ADD_BLOCK. BISH_R and BISL_R (the right-side cell array group 24c, 24d of the block B) or BISH_L and BISL_L (the left-side cell array group 24a, 24b of the block B) are selected according to the modified signals ADDX_NK, ADDXB_NK. The main word line driving unit MWLD_1~MWLD_2n also selects the right or left side of the word line of the currently-selected block B according to the word line selection address ADD_WL. As compared with the conventional semiconductor memory device performing the NK refresh operation, the selected right-side or left-side main word line MWL_R, MWL_L turns on half the cells as in the semiconductor memory device performing the 2NK refresh operation.

For example, when "ADDX_NK" is at a high level in FIG. 4, if the left-side cell array group 24a, 24b of the block B is selected, the left-side main word line MWL_L is enabled in the block set by the NK refresh cycle according to the high level "ADDX_NK", thereby enabling one word line in every NK word line. Here, BISH_L and BISL_L or the cell array group 24a, 24b according to the NK refresh cycle are enabled in order to turn on the corresponding bit line sense amp BL S/A.

As discussed earlier, in accordance with the present invention, when the 2NK and NK refresh operations are simultaneously embodied, if the read/write operation is carried out by using the address compressed in the device set up by the NK refresh operation, the right or left side of the main word line is merely enabled. As a result, as compared with the 2NK refresh operation, a length of the word line to be enabled is reduced to a half, and thus the number of the cells connected to the word line is also decreased. It implies that the load of the main word line driving circuit is reduced to a half, thereby remarkably improving the speed at the row path side.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor memory device having a block set consisting of a plurality of blocks which are aligned in a vertical direction and which consist of a plurality of cell arrays aligned in a horizontal direction, comprising:

a unit for receiving and buffering a block set division address, a refresh mode designating signal and a refresh request signal;

a unit for receiving the block set division address to be compressed among the output signals from the buffering unit and a block selection address, and selecting one of the plurality of blocks;

a unit for decoding modified signals outputted from the buffering unit, and selecting a right-side or left-side cell array group of a main word line having a double word line structure from the selected block; and a unit for buffering and decoding word line selection address signals, and driving a corresponding main word line, the block set being divided into the identical number of the cell array groups symmetrically from a sub-word line driver positioned at the centers of each block, the right-side cell array groups and the left-side cell array groups being connected respectively to the main word line driving units through the different main word lines.

2. The semiconductor memory device according to claim 1, wherein the buffering unit comprises:

a differential amplifier for comparing the block set division address with a reference voltage;

a first logic circuit for receiving and combining a signal from a first output terminal of the differential amplifier and the refresh mode designating signal, and outputting one signal to be compressed;

a second logic circuit for receiving and combining a signal from a second output terminal of the differential amplifier and the refresh mode designating signal, and outputting another signal to be compressed with the signal to be compressed;

a first combinational logic circuit unit for receiving and logic-operating the signal from the first output terminal of the differential amplifier, the refresh mode designating signal and the refresh request signal, and outputting first modified signal; and a second combinational logic circuit unit for receiving and logic-operating the signal from the second output terminal of the differential amplifier, the refresh mode designating signal and the refresh request signal, and outputting second modified signal.

3. The semiconductor memory device according to claim 2, wherein the first logic circuit is a NAND gate.

4. The semiconductor memory device according to claim 2, wherein the second logic circuit is a NAND gate.

5. The semiconductor memory device according to claim 2, wherein the first combinational logic circuit unit comprises:

an inverter for inverting the refresh mode designating signal; and a logic circuit for receiving and logic-operating the signal from the first output terminal of the differential amplifier and the refresh request signal.

6. The semiconductor memory device according to claim 5, wherein the logic circuit is a NAND gate.

7. The semiconductor memory device according to claim 2, wherein the second combinational logic circuit unit comprises:

an inverter for inverting the refresh mode designating signal; and a logic circuit for receiving and logic-operating the signal from the second output terminal of the differential amplifier and the refresh request signal.

8. The semiconductor memory device according to claim 7, wherein the logic circuit is a NAND gate.

9. The semiconductor memory device according to claim 1, wherein the main word line driving unit comprises:

a first path control circuit for enabling the corresponding main word line according to a first word line selection address signal;

a second path control circuit for enabling the corresponding main word line according to a second word line selection address signal;

a third path control circuit for enabling the corresponding main word line according to a third word line selection address signal; and a fourth path control circuit for enabling the corresponding main word line according to a fourth word line selection address signal.

10. The semiconductor memory device according to claim 8, wherein the first to fourth path control circuits respectively comprise:

a precharge unit for precharging a signal from the output terminal to a predetermined level according to the block selection signal and the word line selection address signal; and a latch unit for latching an output signal from the precharge unit, and driving the corresponding main word line.

11. The semiconductor memory device according to claim 9, wherein the precharge unit comprises:

a transistor turned on/off according to the block selection signal; and a transistor turned on/off according to the word line selection address signal.

12. The semiconductor memory device according to claim 9, wherein the latch unit comprises:

inverters connected in series between the output terminal and the main word line; and a transistor connected between the power supply terminal and the output terminal, and turned on/off according to an output signal from the inverter.

* * * * *